(12) United States Patent
Pehlivanoglu (10) Patent No.: US 9,048,786 B2
(45) Date of Patent: *Jun. 2, 2015

(54) SWITCHING SYSTEM WITH LINEARIZING CIRCUIT

(71) Applicant: Skyworks Solutions, Inc., Woburn, MA (US)

(72) Inventor: Ibrahim Engin Pehlivanoglu, Costa Mesa, CA (US)

(73) Assignee: Skyworks Solutions, Inc., Woburn, MA (US)

(*) Notice: Subject to any disclaimer, the term of this patent is extended or adjusted under 35 U.S.C. 154(b) by 0 days.

This patent is subject to a terminal disclaimer.

(21) Appl. No.: 14/020,448

(22) Filed: Sep. 6, 2013

(65) Prior Publication Data

US 2014/0106685 A1  Apr. 17, 2014

Related U.S. Application Data

(63) Continuation of application No. 13/339,217, filed on Dec. 28, 2011, now Pat. No. 8,532,602, which is a continuation of application No. PCT/US2009/049292, filed on Jun. 30, 2009.

(51) Int. Cl.
*H04B 1/44* (2006.01)
*H03D 7/14* (2006.01)
*H03D 7/16* (2006.01)

(52) U.S. Cl.
CPC ........... *H03D 7/1491* (2013.01); *H03D 7/1458* (2013.01); *H03D 7/165* (2013.01); *H03D 2200/0088* (2013.01); *H04B 1/44* (2013.01)

(58) Field of Classification Search
USPC .......................................... 455/78
See application file for complete search history.

(56) References Cited

U.S. PATENT DOCUMENTS

| | | | |
|---|---|---|---|
| 6,121,818 A | 9/2000 | Kim et al. | |
| 6,667,649 B1 | 12/2003 | Lee | |
| 7,119,585 B2 | 10/2006 | Ranganathan | |
| 8,126,036 B2 * | 2/2012 | Koren et al. ................. | 375/219 |
| 8,532,602 B2 | 9/2013 | Pehlivanoglu | |
| 2002/0125922 A1 | 9/2002 | Kawagoshi et al. | |
| 2004/0229589 A1 | 11/2004 | Behzad | |
| 2005/0140397 A1 | 6/2005 | Gupta | |
| 2005/0231256 A1 | 10/2005 | Donoghue et al. | |
| 2007/0047927 A1 * | 3/2007 | Collins et al. ................ | 388/804 |
| 2007/0229140 A1 * | 10/2007 | Wang ............................ | 327/359 |

FOREIGN PATENT DOCUMENTS

TW        2007 45526 A     12/2007

OTHER PUBLICATIONS

International Search Report re International Application No. PCT/US2009/049292, dated Apr. 1, 2010.
International Preliminary Report on Patentability and Written Opinion, re International Application No. PCT/US2009/049292, dated Jan. 4, 2012.

(Continued)

*Primary Examiner* — Ajibola Akinyemi
(74) *Attorney, Agent, or Firm* — Knobbe Martens Olson & Bear LLP (57) ABSTRACT

A transistor-based switch is coupled to a replica circuit that includes transistor circuitry similar to that of the switch. The replica circuit biases a switched transistor to promote linear operation of the switch.

20 Claims, 4 Drawing Sheets

(56) References Cited

OTHER PUBLICATIONS

Iizuka et al., "A 194 mW Fully Integrated DVB-H Tuner With a Linearized Variable Gain LNA and Quadrature Mixers Using Cross-Coupled Transductor," IEEE Journal of Solid-State Circuits, vol. 42, No. 4, pp. 862-871, Apr. 2007.

Kousai et al., "An Octave-Range Watt-Level Fully Integrated CMOS Switching Power Mixer Array for Linearization and Back-Off Efficiency Improvement," Solid-State Circuits Conference—Digest of Technical Papers, 2009. ISSCC 2009, IEEE International, pp. 376, 377, 377a, Feb. 8-12, 2009.

Pullela et al., "An Integrated Closed-Loop Polar Transmitter with Saturation Prevention and low-IF Receiver for Quad-band GPRS/EDGE," Solid-State Circuits Conference—Digest of Technical Papers, 2009. ISSCC 2009, IEEE International. pp. 112, 113, 113a, Feb. 8-12, 2009.

Pullela et al., "Low Flicker-Noise Quadrature Mixer Topology,"Solid-State Circuits Conference, 2006, ISSCC 2006, Digest of Technical Papers, IEEE International, pp. 1870, 1879, Feb. 6-9, 2006.

Search Report issued in Taiwan Patent Application No. 102126962, dated Jul. 16, 2004, 6 pages.

\* cited by examiner

SWITCHING SYSTEM WITH LINEARIZING CIRCUIT

CROSS-REFERENCE TO RELATED APPLICATIONS

This application is a continuation of U.S. patent application Ser. No. 13/339,217, filed Dec. 28, 2011, which is a continuation of International Application No. PCT/US2009/049292, filed Jun. 30, 2009, the benefit of the filing date of which is hereby claimed. The disclosures of each of the foregoing applications are incorporated herein by this reference.

BACKGROUND

A metal-oxide semiconductor (MOS) field-effect transistor (MOSFET) can be operated as a switch in the transistor's triode or linear region. Such a switch can be conceptualized as a resistor whose value is controlled by the transistor gate-source voltage. When the gate voltage causes the switch to be closed, the resistance may be only a few ohms, which effectively presents a closed circuit. When the gate voltage causes the switch to be open, the resistance is so high as to effectively present an open circuit. However, in reality there are parasitic capacitances in the transistor. In some instances, the resistance can be non-linear, where the resistance becomes dependent upon the transistor source terminal voltage due to the charging times of capacitances. For example, a MOS transistor-based switch in a mixer of the type used in some wireless telephone handset circuits can be driven into non-linear operation by the larger voltage signals that are commonly employed in direct-conversion radio receivers and transmitters to provide noise immunity. Non-linear operation can result in intermodulation distortion that hampers receiver or transmitter performance.

Figure 1:
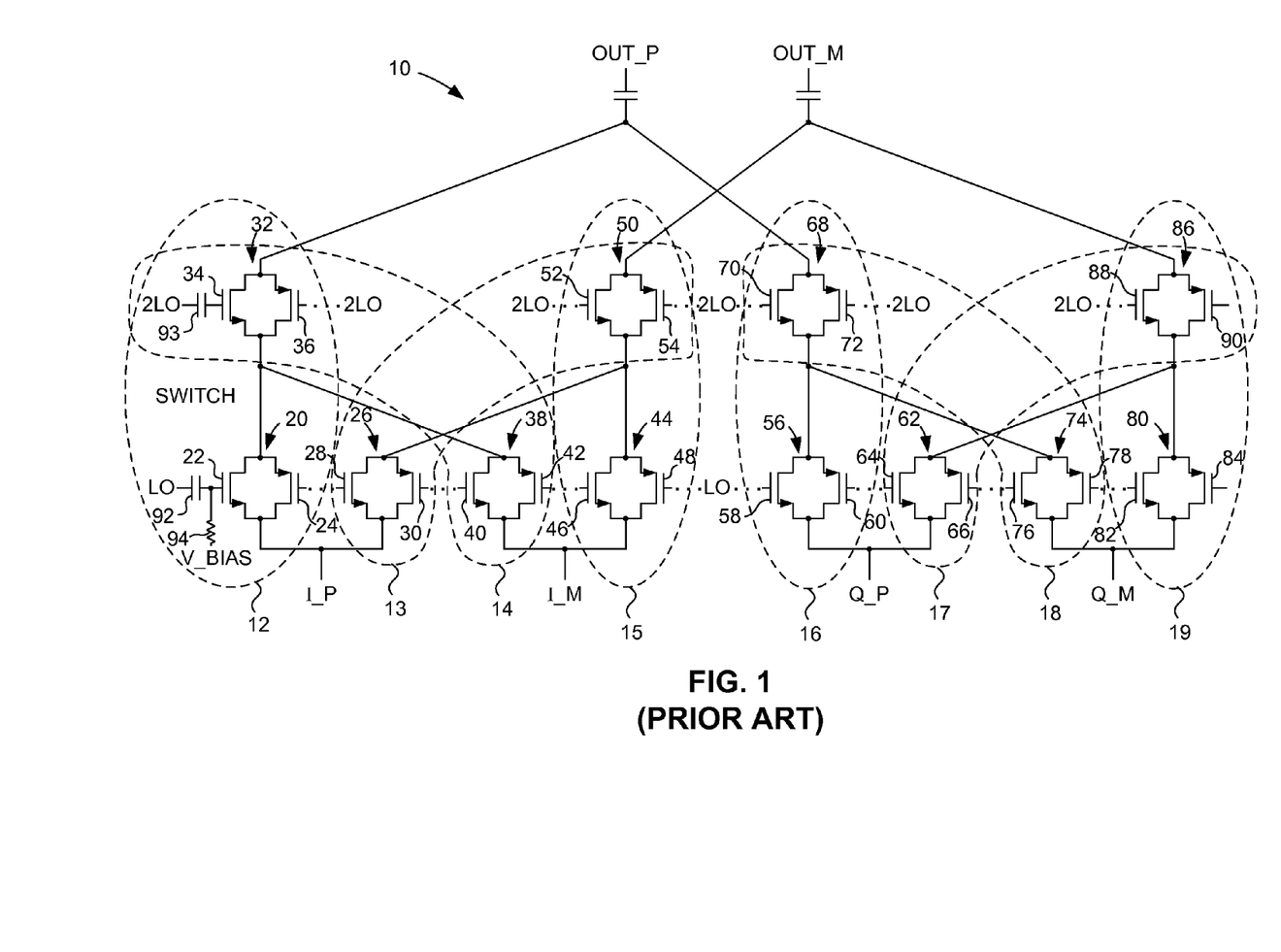
FIG. 1 is a block diagram of a quadrature mixer in accordance with the prior art.

An exemplary quadrature mixer 10 having a transmission gate structure to promote linearity is illustrated in FIG. 1. Mixer 10 has sections that can be referred to for convenience herein as switches 12, 13, 14, 15, 16, 17, 18 and 19. The term "switch" as used herein refers to any circuitry that performs a switching function and can include one or more individual switching elements such as transistors or groups of transistors. Switch 12 mixes a positive in-phase input signal (Ip, labeled in FIG. 1 as "I_P" for readability) with a local oscillator (LO) signal and a frequency-doubled local oscillator (2LO) signal. Switch 14 mixes a negative in-phase input signal (Im, labeled in FIG. 1 as "I_M" for readability) with the LO and 2LO signals. Switch 16 mixes a positive quadrature input signal (Qp, labeled in FIG. 1 as "Q_P" for readability) with the LO and 2LO signals. Switch 18 mixes a negative quadrature (Qm, labeled in FIG. 1 as "Q_M" for readability) input signal with the LO and 2LO signals. As known in the art, timing circuitry (not shown) causes each of these input signals to be asserted sequentially while the others are de-asserted: Ip, Qp, Im, Qm, Ip, Qp . . . . Accordingly, the mixer output signals OUT_P and OUT_M sequentially represent the result of mixing Ip, Qp, Im, Qm, etc., with the LO and 2LO signals. The architecture of mixer 10 is sometimes referred to as "LO-2LO."

Each of switches 12, 13, 14, 15, 16, 17, 18 and 19 includes at least one transmission gate comprising an n-channel MOS (nMOS) transistor and a p-channel MOS (pMOS) transistor in parallel with each other. Switch 12 includes transmission gate 20, comprising nMOS transistor 22 and pMOS transistor 24, and transmission gate 32, comprising nMOS transistor 34 and pMOS transistor 36. Switch 13 includes transmission gate 26, comprising nMOS transistor 28 and pMOS transistor 30, and transmission gate 50, comprising nMOS transistor 52 and pMOS transistor 54. Switch 14 includes transmission gate 38, comprising nMOS transistor 40 and pMOS transistor 42, and transmission gate 32, comprising nMOS transistor 34 and pMOS transistor 36. Switch 15 includes transmission gate 44, comprising nMOS transistor 46 and pMOS transistor 48, and transmission gate 50, comprising nMOS transistor 52 and pMOS transistor 54. Switch 16 includes transmission gate 56, comprising nMOS transistor 58 and pMOS transistor 60, and transmission gate 68, comprising nMOS transistor 70 and pMOS transistor 72. Switch 17 includes transmission gate 62, comprising nMOS transistor 64 and pMOS transistor 66, and transmission gate 86, comprising nMOS transistor 88 and pMOS transistor 90. Switch 18 includes transmission gate 74, comprising nMOS transistor 76 and pMOS transistor 78, and transmission gate 68, comprising nMOS transistor 70 and pMOS transistor 72. Switch 19 includes transmission gate 80, comprising nMOS transistor 82 and pMOS transistor 84, and transmission gate 86, comprising nMOS transistor 88 and pMOS transistor 90. Note that some transmission gates are included in two switches.

The LO signals are coupled to the gate terminals of transistors 22, 24, 28, 30, 40, 42, 46, 48, 58, 60, 64, 66, 76, 78, 82 and 84, while the 2LO signals are coupled to the gate terminals of transistors 34, 36, 52, 54, 70, 72, 88 and 90. The LO signals are coupled to the gate terminals via capacitors 92, although only one such capacitor 92 is shown for purposes of clarity. (The ellipsis symbol (". . .") is used herein to indicate circuitry or connections not shown.) Similarly, the 2LO signals are coupled to the gate terminals via capacitors 93, although only one such capacitor 93 is shown for purposes of clarity. The gate terminals are also coupled to a fixed or constant bias voltage, V_BIAS, via resistors 94, although only one such resistor 94 is shown for purposes of clarity. It can be noted that the above-referenced gate terminals are coupled to various time-shifted versions of the LO and 2LO signals, which can be referred to as LO_I_P, LO_I_M, LO_Q_P, LO_Q_M, 2LO_P and 2LO_M, although in FIG. 1 all such signals are simply labeled either "LO" or "2LO" (i.e., without differentiation) for purposes of clarity.

Including the pMOS transistors promotes linear switch operation. It is known that by sizing the pMOS transistor on the order of three times larger than the nMOS transistor in each transmission gate, the transmission gate can be made to switch substantially linearly (i.e., the transmission gate resistance is made linear) over the range of voltages commonly employed in mixers used in some direct-conversion radio receivers and transmitters. If the pMOS transistors were not present (i.e., only nMOS transistors were present) or were not sized in this manner, and if no other measures were taken to promote linear operation, the switching would be susceptible to non-linear operation due to parasitic capacitances between switches. In non-linear operation, the transition time from one output signal, Ip, Qp, Im, Qm, etc., to the next in the sequence depends upon the voltages of those signals, due to the charging times of the capacitances. That is, the previous voltage state of the parasitic capacitance introduces a memory effect, which is the source of the non-linearity.

Other techniques for improving switch linearity have been described, such as feeding back the signal at the source terminal of the switching transistor to the gate of an nMOS transistor to cause the gate voltage to follow the source voltage, such that the gate-to-source voltage is nearly constant. Such a "feedback" or "bootstrapping" technique may not provide good results in a passive mixer of the type used in some direct conversion radio receivers and transmitters because the source and drain terminal voltages of symmetric CMOS transistors interchange, i.e., switch, with one another during mixer operation.

SUMMARY

Embodiments of the invention relate to a switching system and method in which a replica circuit that includes transistor circuitry similar to the switching circuitry of a corresponding switch linearizes the operation of the switch, i.e., linearizes the switch resistance during switching, by adjusting a transistor gate bias voltage. In exemplary embodiments of the invention, the switch switches between at least two signals in response to a switching signal. For example, the switch can be a mixer in a radio receiver or transmitter that mixes one or more local oscillator signals with received signals as part of a downconversion or similar step. In a mixer, the local oscillator signals act as the switching signals. The signals between which the switch switches in response to the local oscillator signals can include, for example in a quadrature mixer, a positive in-phase (Ip) signal, a negative in-phase (Im) signal, a positive quadrature (Qp) signal, and a negative quadrature (Qm) signal. (As used herein, the "p" in such signal names refers to the "positive" or "plus" side of a differential signal, and the "m" refers to the negative or "minus" side.) The switch has one or more switching elements, each comprising one or more transistors including at least one switched transistor that can be switched on and off in response to the switching signal. For example, in a quadrature mixer, there can be Ip, Im, Qp and Qm switching elements. The replica circuit produces a bias voltage, which is applied to a gate terminal or other control terminal of the switched transistor to promote linear switch operation. Embodiments of the invention can include any number of switches, each having any number of switching elements. Each switching element can have any number of transistors. In an embodiment having more than one switching element, there can a corresponding replica circuit for each switching element.

In exemplary embodiments of the invention, the replica circuit includes a replica switching element circuit, a reference resistance, and an operational amplifier (op-amp) circuit. The replica switching element circuit has one or more transistors that correspond to the transistors of the corresponding switching element. (As used in this context herein with regard to the exemplary embodiment, "correspond" means that the transistors of the replica switching element circuit are arranged in substantially the same arrangement as the transistors of the switching element, and are either of substantially the same size and structure as the transistors of the switching element or are scaled versions of the transistors of the switching element.) In either case, the transistor circuitry of the replica switching element replicates or is similar to the transistor circuitry of the switching element of the switch. (The term "replica" is not intended to mean that the two circuits are exactly identical.) Similarly, the reference resistance has a value that corresponds to (i.e., is substantially the same as, or is a scaled version of) the resistance of the switching element. The reference resistance has a first terminal coupled to a first terminal of the replica switching element circuit. The op-amp circuit has a first input coupled to a second terminal of the reference resistance, a second input coupled to a second terminal of the replica switching element circuit, and an output coupled to a control terminal of the switched transistor and a corresponding control terminal of the replica switching element circuit.

Other systems, methods, features, and advantages of the invention will be or become apparent to one with skill in the art upon examination of the following figures and detailed description.

BRIEF DESCRIPTION OF THE FIGURES

The components within the figures are not necessarily to scale, emphasis instead being placed upon clearly illustrating the principles of the invention. Moreover, in the figures, like reference numerals designate corresponding parts throughout the different views.

DETAILED DESCRIPTION

Figure 2:
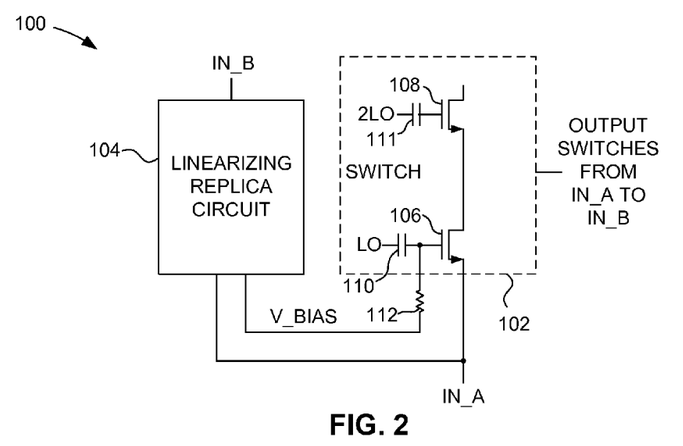
FIG. 2 is a block diagram of a switching system that includes a switching element of, for example, the quadrature mixer of FIG. 1, and a linearizing replica circuit, in accordance with an exemplary embodiment of the invention.

As illustrated in FIG. 2, in accordance with an illustrative or exemplary embodiment of the invention, a switching system 100, which as described below in further detail can comprise, for example, a mixer, can be linearized, i.e., made to switch more linearly, by coupling a switch 102, which performs part or all of the switching function of switching system 100, to a linearizing replica circuit (LRC) 104. Although the mixer or other switching system 100 may include any number of switches, the portion represented by switch 102 in the exemplary embodiment includes a switched transistor 106 and a second transistor 108. In the case of a mixer having an LO-2LO architecture, switched transistor 106 can be any transistor that has an LO signal coupled to its gate terminal, and second transistor 108 can be any transistor that correspondingly has a 2LO signal coupled to its gate terminal. The LO signal is coupled to the gate terminal of switched transistor 106 via a capacitor 110. The 2LO signal is coupled to the gate terminal of second transistor 108 via a capacitor 111. (As used herein, the term "coupled" means connected via zero or more intermediate elements.) The drain terminal of switched transistor 106 is connected to the source terminal of transistor 108. The source terminal of switched transistor 106 is coupled to the signal IN_A that is switched by switch 102. For example, in a quadrature mixer IN_A can be any one of the Ip, Qp, Im and Qm signals. The signal IN_A is also provided to LRC 104. In a mixer that transitions its output from one of the mixer input signals (e.g., Ip, Qp, Im, Qm, etc.) to the next in the sequence, both of the signals between which the mixer transitions as a result of the operation of switch 102 are provided to LRC 104. Thus, while the signal IN_A is provided to switch 102 for switching, both IN_A and another signal IN_B are provided to LRC 104. For example, IN_A can be the signal to which the mixer transitions, while IN_B can be the signal from which the mixer transitions. Based upon the feedback provided by IN_A and IN_B, LRC 104 produces a bias signal, V_BIAS. The bias signal V_BIAS is coupled to the gate terminal of switched transistor 106 via a resistor 112 to promote linearization of the operation of switched transistor 106.

Figure 3:
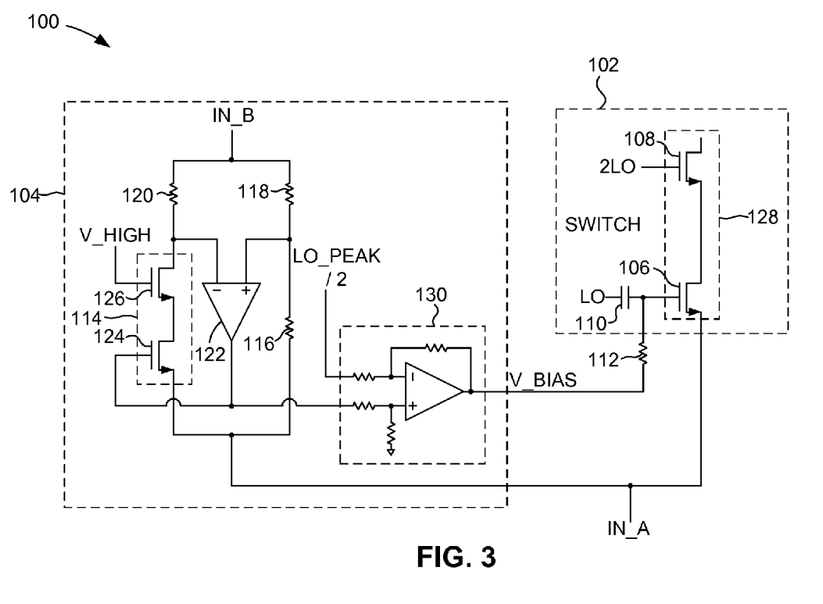
FIG. 3 is similar to FIG. 2, showing an exemplary linearizing replica circuit in further detail.

As illustrated in FIG. 3, LRC 104 includes a replica switching element circuit 114, a reference resistance 116, replica load resistances 118 and 120, and an operational amplifier (op-amp) circuit 122. The load resistance represents the average load at the mixer output (e.g., OUT_P and OUT_M in FIG. 6, described below), i.e., the time-averaged impedance of the capacitance seen at each mixer output (e.g., OUT_P or OUT_M). The resistance of load resistances 118 and 120 are equal to one another. Replica switching element circuit 114 includes transistors 124 and 126, which are substantially the same as, and arranged in substantially the same arrangement as, a switching element 128 comprising switching transistor 106 and second transistor 108. Switching element 128 and the corresponding replica switching element circuit 114 each comprises two transistors because in the exemplary embodiment switch 102 is part of an LO-2LO mixer. However, in embodiments in which the switch is of another type or included in a different type of switching system, a switching element can include more than two transistors or as few as a single transistor.

Reference resistance 116 has a value substantially the same as the resistance of replica switching element circuit 114, i.e., the resistance of transistors 124 and 126 in series. (As used herein, the term "substantially" refers to the recognition that while it is desirable to make reference resistance 116 have the same value as the resistance of switching element 128, it may not be possible to precisely achieve this goal, and the value of reference resistance 116 may be greater or smaller than the resistance of switching element 128 by an amount that is too insubstantial to prevent the circuit from operating in the intended manner.) The value of reference resistance 116 can also be selected so as to ensure that the output of op-amp circuit 122 does not saturate at any expected operational input signal level.

The first terminals of load resistances 118 and 120 are connected together and to the signal IN_B. A first terminal of reference resistance 116 is coupled to a first terminal of replica switching element circuit 114 (specifically, to the source terminal of transistor 124. A second terminal of reference resistance 116 is coupled to a first input of op-amp circuit 122 (e.g., the positive or non-inverting input) and to a second terminal of load resistance 118. A second terminal of op-amp circuit 122 (e.g., the negative or inverting input) is coupled to a second terminal of replica switching element circuit 114 and a second terminal of load resistance 120. The output of op-amp circuit 122 is coupled to the gate terminal of transistor 124. The signal that op-amp circuit 122 outputs is first level-shifted by a level shifter 130, and the shifted signal is the bias signal V_BIAS. The gate terminal of transistor 126 is connected to a source of a "high" voltage (V_HIGH) that maintains transistor 126 in an "on" state. The voltage V_HIGH is the same as the voltage level at which the 2LO signal coupled to the gate terminal of second transistor 108 is sufficient to cause second transistor 108 to turn on.

Op-amp circuit 122 includes an op-amp or, alternatively, circuitry that operates in a manner similar to an op-amp. In operation, op-amp circuit 122 causes the voltages at its input terminals to be equal to each other by adjusting its output signal. Thus, the voltage drop across replica switching element circuit 114 (i.e., across transistors 124 and 126 in series) must equal the voltage drop across reference resistance 116. To achieve this operational state, the output of op-amp circuit 122 adjusts the gate voltage of transistor 124 so that the resistance of replica switching element circuit 114 (i.e., the series resistance of transistors 124 and 126) is equal to the value of reference resistance 116. The adjusted gate voltage of transistor 124 is also applied (via level-shifter 130) to the gate terminal of switched transistor 106 as the bias voltage V_BIAS. As reference resistance 116 responds linearly to a change in voltage across it, the resistance of replica switching element circuit 114 likewise responds linearly to a change in voltage across it. As the bias voltage V_BIAS that causes replica switching element circuit 114 to behave linearly is also applied to switched transistor 106, switched transistor 106 and its switching element 128 likewise behave linearly.

Figure 4:
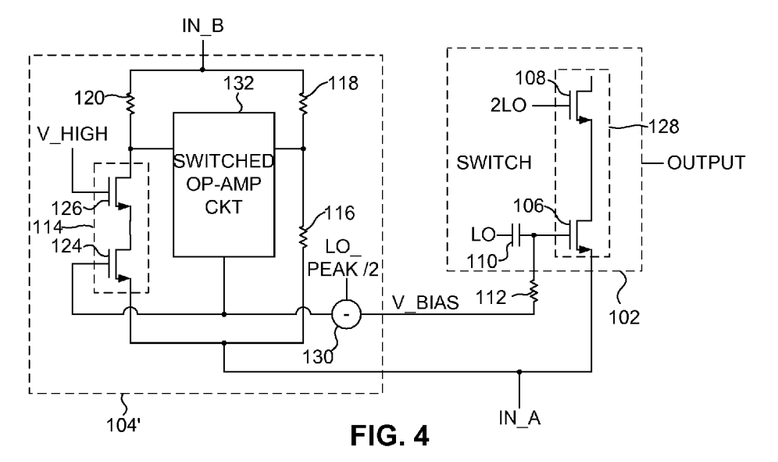
FIG. 4 is similar to FIG. 2, showing an alternative exemplary linearizing replica circuit.
Figure 5:
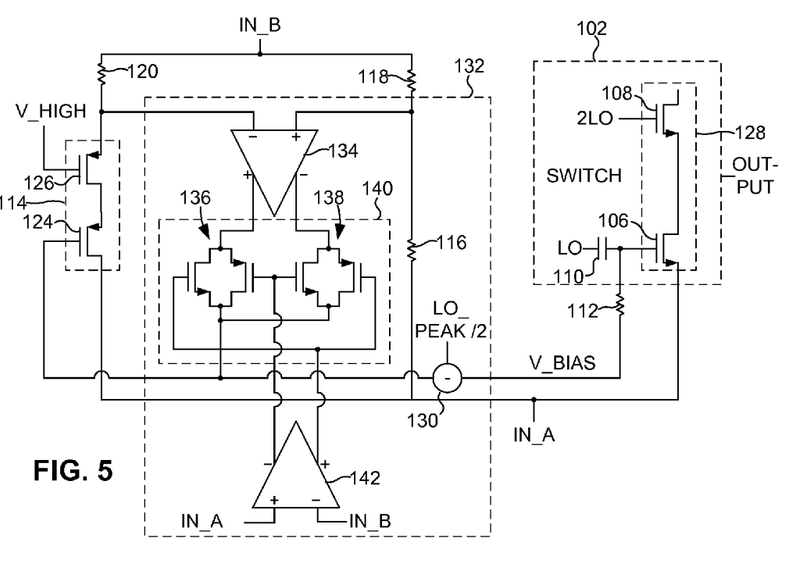
FIG. 5 is similar to FIG. 3, showing the alternative linearizing replica circuit in further detail.

As illustrated in FIGS. 4 and 5, in other embodiments a switched op-amp circuit 132 can be included in a similar LRC 104' instead of op-amp circuit 122 (FIG. 3). Op-amp circuit 122 operates in the manner described above so long as the signal IN_A is greater than the signal IN_B. However, in some instances, such as embodiments in which the switching system is a passive mixer of the type described above, signal IN_A can be greater than signal IN_B at times, while at other times signal IN_B can be greater than signal IN_A. When IN_B is greater than IN_A, the direction of the currents is reversed, and the circuit generates positive rather than negative feedback, preventing op-amp circuit 122 from achieving a state in which the resistance of replica switching element circuit 114 is equal to the value of reference resistance 116. In the embodiment shown in FIG. 5, switched op-amp circuit 132 includes additional circuitry that outputs a signal having a polarity that depends upon which of IN_A and IN_B is greater than the other.

Switched op-amp circuit includes an op-amp 134 or, alternatively, circuitry that operates in a manner similar to an op-amp, two transmission gates 136 and 138 that form a polarity selection circuit 140, and a comparator circuit 142. Comparator circuit 142 can comprise a comparator, op-amp or similar circuitry that can determine which of two signals is greater than the other. One input of comparator circuit 142 (e.g., the positive or non-inverting input) is coupled to signal IN_A, and the other input of comparator circuit 142 (e.g., the negative or inverting input) is coupled to signal IN_B. If signal IN_A is greater than signal IN_B, comparator circuit 142 asserts its positive or non-inverting output and de-asserts its negative or inverting output. If signal IN_B is greater than signal IN_A, comparator circuit 142 asserts its negative or inverting output and de-asserts its positive or non-inverting output. The positive or non-inverting output of comparator circuit 142 is coupled to the gate terminal of one transistor of each transmission gate, and the negative or inverting output of comparator circuit 142 is coupled to the gate terminal of the other transistor of each transmission gate. Polarity selection circuit 140 has a first input coupled to the positive or non-inverting output of op-amp 134 and a second input coupled to the negative or inverting output of op-amp 134. Thus, if comparator circuit 142 determines that IN_A is greater than IN_B, then the output signal from comparator circuit 142 closes or activates transmission gate 136, which thus passes the signal provided by the positive or non-inverting output of op-amp 134, and opens or deactivates transmission gate 138, which thus blocks the signal provided by the negative or inverting output of op-amp 134. Conversely, if comparator circuit 142 determines that IN_B is greater than IN_A, then the output signal from comparator circuit 142 closes or activates transmission gate 136, which thus passes the signal provided by the positive or non-inverting output of op-amp 134, and opens or deactivates transmission gate 138, which thus blocks the signal provided by the negative or inverting output of op-amp 134. The signal that polarity selection circuit 140 passes (by the above-described operation of transmission gates 136 and 138) is provided as the bias signal V_BIAS (via level shifter 130).

Figure 6:
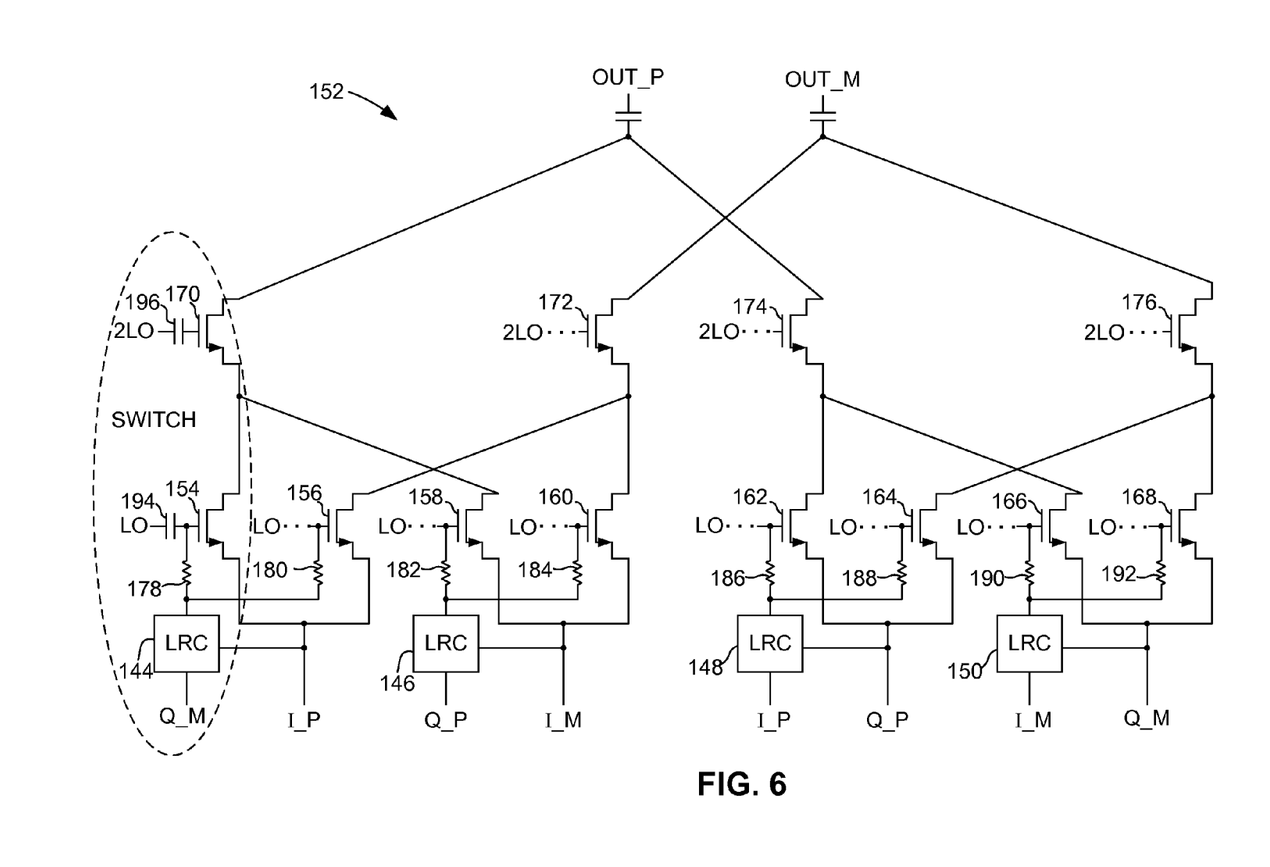
FIG. 6 is a block diagram of a switching system that includes a quadrature mixer with switching elements linearized by corresponding replica circuits, in accordance with an exemplary embodiment of the invention.

As illustrated in FIG. 6, LRCs 144, 146, 148 and 150 of the type described above with regard to FIGS. 2-5 (e.g., LRC 104 or 104') can be used in a switching system 152 that comprises a quadrature mixer of the type used in some radio receivers. Note that switching system 152 includes only nMOS transistors 154, 156, 158, 160, 162, 164, 166, 168, 170, 172, 174 and 176, and does not include any pMOS transistors. The use of pMOS transistors increases the load to the circuitry (not shown) that generates the LO and 2LO signals and thus the current. It is desirable to minimize current in portable radio receivers, such as those of wireless telephone handsets, so as to minimize battery drain. Therefore, in the embodiment shown in FIG. 6 the switching elements of the mixer do not include pMOS. As LRCs 144, 146, 148 and 150 promote linear switch operation, no pMOS is needed for that purpose.

Switching system 152 has an LO-2LO architecture that is generally analogous to that described above with regard to FIG. 1 except that the gate terminals of transistors 154, 156, 158, 160, 162, 164, 166 and 168 are coupled to LRCs 144, 146, 148 and 150 to provide the bias voltage V_BIAS instead of a fixed or constant bias voltage. More specifically, the gate terminals of transistors 154 and 156 are coupled to LRC 144 via resistors 178 and 180, respectively; the gate terminals of transistors 158 and 160 are coupled to LRC 144 via resistors 182 and 184, respectively; the gate terminals of transistors 162 and 164 are coupled to LRC 148 via resistors 186 and 188, respectively; and the gate terminals of transistors 166 and 168 are coupled to LRC 150 via resistors 190 and 192, respectively. The LO signals are coupled to the gate terminals of transistors 154, 156, 158, 160, 162, 164, 166 and 168 via corresponding capacitors 194, although only one such capacitor 194 is shown for purposes of clarity. Similarly, the 2LO signals are coupled to the gate terminals of transistors 170, 172, 174 and 176 via other capacitors 196, although only one such capacitor 196 is shown for purposes of clarity. It can be noted that these gate terminals are coupled to various time-shifted versions of the LO and 2LO signals, which can be referred to as LO_I_P, LO_I_M, LO_Q_P, LO_Q_M, 2LO_P and 2LO_M, although in FIG. 6 all such signals are simply labeled "LO" and "2LO" (i.e., without differentiation) for purposes of clarity. Persons skilled in the art are familiar with such signals and their timing relationships and will readily be capable of providing suitable circuitry for generating these signals and providing them to the appropriate transistors.

While various embodiments of the invention have been described, it will be apparent to those of ordinary skill in the art that many more embodiments and implementations are possible that are within the scope of this invention. Accordingly, the invention is not to be restricted except in light of the following claims.

What is claimed is:

1. A switching system, comprising:
    a switch including one or more transistors and a control terminal; and
    a linearizing circuit including a reference resistance, a replica switching element circuit having one or more transistors, and a switch control output electrically coupled to the control terminal of the switch, the linearizing circuit providing a replica control signal to the replica switching element circuit to control the replica switching element circuit to maintain a voltage drop across the replica switching element circuit at a level that corresponds to a voltage drop across the reference resistance, the switch control output responsive to the replica control signal thereby promoting linearization of operation of the switch, the linearizing circuit further including an operational amplifier configured to provide the replica control signal, a first input of the operational amplifier being coupled to a first terminal of the replica switching element circuit, a second input of the operational amplifier being coupled to a first terminal of the reference resistance, and an output of the operational amplifier being configured to provide the replica control signal.

2. The switching system of claim 1 wherein the switch includes only nMOS transistors and does not include any pMOS transistors.

3. The switching system of claim 1 wherein the switch is configured to switch in response to a local oscillator (LO) signal and a frequency-doubled local oscillator (2LO) signal of a radio-frequency receiver circuit or transmitter circuit.

4. The switching system of claim 3 wherein the switching system forms part of a quadrature mixer.

5. The switching system of claim 4 wherein the quadrature mixer is configured to receive a plurality of mixer input signals including a positive in-phase (Ip) signal, a negative in-phase (Im) signal, a positive quadrature (Op) signal, and a negative quadrature (Om) signal, the quadrature mixture further configured to mix the mixer input signals with the LO and 2LO signals to generate corresponding mixed output signals, and to sequentially output the mixed output signals on an output of the quadrature mixer.

6. The switching system of claim 1 wherein the one or more transistors of the switch correspond to the one or more transistors of the replica switching element circuit.

7. A switching system comprising:
    a switch including one or more transistors and a control terminal; and
    a linearizing circuit including a reference resistance, a replica switching element circuit having one or more transistors, and a switch control output electrically coupled to the control terminal of the switch, the linearizing circuit providing a replica control signal to the replica switching element circuit to control the replica switching element circuit to maintain a voltage drop across the replica switching element circuit at a level that corresponds to a voltage drop across the reference resistance, the switch control output responsive to the replica control signal thereby promoting linearization of operation of the switch, the switch including only nMOS transistors and not including any pMOS transistors, the switch control output providing a level shifted version of the replica control signal to the control terminal of the switch.

8. The switching system of claim 7 wherein the replica switching element circuit includes only nMOS transistors and does not include any pMOS transistors.

9. The switching system of claim 7, wherein the linearizing circuit further includes an operational amplifier configured to provide the replica control signal.

10. A wireless device comprising:
    a radio frequency antenna;
    a radio frequency transmitter coupled to the antenna; and
    a radio frequency receiver coupled to the antenna and including a switching system, the switching system including a switch having one or more transistors and a control terminal, the switching system further including a linearizing circuit including a reference resistance, a replica switching element circuit having one or more transistors, and a switch control output electrically coupled to the control terminal of the switch, the linearizing circuit providing a replica control signal to the replica switching element circuit to control the replica switching element circuit to maintain a voltage drop across the replica switching element circuit at a level that corresponds to a voltage drop across the reference resistance, the switch control output responsive to the replica control signal thereby promoting linearization of operation of the switch, the switch being configured to switch in response to one or more local oscillator signals of a radio-frequency receiver circuit or transmitter circuit.

11. The wireless device of claim 10 wherein the switch and the replica switching element circuit include only nMOS transistors and do not include any pMOS transistors.

12. The wireless device of claim 11 wherein the switch control output provides a level shifted version of the replica control signal to the control terminal of the switch.

13. The wireless device of claim 10, wherein the linearizing circuit further includes an operational amplifier configured to provide the replica control signal.

14. The wireless device of claim 10 wherein the switch is configured to switch in response to a local oscillator (LO) signal and a frequency-doubled local oscillator (2LO) signal of a radio-frequency receiver circuit or transmitter circuit.

15. The wireless device of claim 14 wherein the switching system forms part of a quadrature mixer.

16. The wireless device of claim 15 wherein the quadrature mixer is configured to receive a plurality of mixer input signals including a positive in-phase (Ip) signal, a negative in-phase (Im) signal, a positive quadrature (Op) signal, and a negative quadrature (Om) signal, to mix the mixer input signals with the LO and 2LO signals to generate corresponding mixed output signals, and to sequentially output the mixed output signals.

17. A wireless device comprising:
a radio frequency antenna;
a radio frequency transmitter coupled to the antenna; and
a radio frequency receiver coupled to the antenna and including a switching system, the switching system including a switch having one or more transistors and a control terminal, the switching system further including a linearizing circuit including a reference resistance, a replica switching element circuit having one or more transistors, and a switch control output electrically coupled to the control terminal of the switch, the linearizing circuit providing a replica control signal to the replica switching element circuit to control the replica switching element circuit to maintain a voltage drop across the replica switching element circuit at a level that corresponds to a voltage drop across the reference resistance, the switch control output responsive to the replica control signal thereby promoting linearization of operation of the switch, the linearizing circuit further including an operational amplifier configured to provide the replica control signal, a first input of the operational amplifier being coupled to a first terminal the replica switching element circuit, a second input of the operational amplifier being coupled to a first terminal of the reference resistance, and an output of the operational amplifier being configured to provide the replica control signal.

18. A quadrature mixer comprising:
an input stage having four inputs each configured to receive a corresponding one of a positive in-phase (Ip) signal, a negative in-phase (Im) signal, a positive quadrature (Op) signal, and a negative quadrature (Om) signal;
four switching units each corresponding to a respective one of the four inputs, each of the switching units including a switch having one or more transistors and a control terminal, each of the switching units further including a linearizing circuit having a reference resistance, a replica switching element circuit having one or more transistors, and a switch control output electrically coupled to the control terminal of the switch, the linearizing circuit providing a replica control signal to the replica switching element circuit to control the replica switching element circuit to maintain a voltage drop across the replica switching element circuit at a level that corresponds to a voltage drop across the reference resistance, the switch control output responsive to the replica control signal on the switch control output thereby promoting linearization of operation of the switch; and
an output stage coupled to the four switching units and sequentially providing mixed output signals that correspond to the four inputs.

19. The quadrature mixer of claim 18 wherein the linearizing circuit further includes an operational amplifier configured to provide the replica control signal and a first input of the operational amplifier is coupled to a first terminal the replica switching element circuit, a second input of the operational amplifier is coupled to a first terminal of the reference resistance, and an output of the operational amplifier is configured to provide the replica control signal.

20. The quadrature mixer of claim 18 wherein the switch of each of the four switching inputs is configured to switch in response to one or more local oscillator signals of a radio-frequency receiver circuit or transmitter circuit.

* * * * *